US008106790B2

(12) United States Patent
Rioult et al.

(10) Patent No.: US 8,106,790 B2
(45) Date of Patent: Jan. 31, 2012

(54) MEASURING DEVICE FOR THE ELECTROMAGNETIC FIELD EMITTED BY AN APPARATUS BEING TESTED

(75) Inventors: Jean Rioult, Lille (FR); Marc Heddebaut, Sainghin En Melantois (FR); Virginie Collins-Deniau, Raches (FR)

(73) Assignee: INRETS-Institut National de Recherche sur les Transports et leur Securite, Bron (FR)

( * ) Notice: Subject to any disclaimer, the term of this patent is extended or adjusted under 35 U.S.C. 154(b) by 425 days.

(21) Appl. No.: 12/517,141

(22) PCT Filed: Nov. 15, 2007

(86) PCT No.: PCT/FR2007/052342
§ 371 (c)(1),
(2), (4) Date: Jun. 1, 2009

(87) PCT Pub. No.: WO2008/065290
PCT Pub. Date: Jun. 5, 2008

(65) Prior Publication Data
US 2010/0097236 A1   Apr. 22, 2010

(30) Foreign Application Priority Data
Dec. 1, 2006   (FR) .................................. 06 55261

(51) Int. Cl.
*G08B 21/00* (2006.01)

(52) U.S. Cl. ..................................... 340/686.1; 343/841
(58) Field of Classification Search ............... 340/686.1; 250/336.1, 366; 324/95, 545; 343/703, 795, 343/841
See application file for complete search history.

(56) References Cited

U.S. PATENT DOCUMENTS

| 6,084,551 | A  | * | 7/2000  | Aslan ............................ 343/703 |
| 6,492,957 | B2 | * | 12/2002 | Carillo et al. ................. 343/841 |
| 6,686,761 | B2 | * | 2/2004  | Pan et al. ...................... 324/545 |
| 2002/0075189 | A1 |  | 6/2002 | Carillo |

OTHER PUBLICATIONS

Z. Altman et al., "Spherical Near field Facility for Characterizing Random Emission", IEEE Transactions on antennas and propagation, IEEE service center, vol. 53, No. 8, Aug. 2005, XP011137410, ISSN: 0018-926X, pp. 258-259. (abstract provided).
International Search Report dated May 16, 2008, from corresponding PCT application.

* cited by examiner

*Primary Examiner* — John A Tweel, Jr.
(74) *Attorney, Agent, or Firm* — Young & Thompson

(57) ABSTRACT

Measuring device (1) for the electromagnetic field emitted by an apparatus being tested (11, 14), including a support (3) being mobile in relation to the apparatus being tested, at least one electromagnetic sensor (8) fixed to the support and driving elements (5,6) capable of rotating the support around the apparatus being tested, characterized in that it includes at least one light source (9) adjacent to the electromagnetic sensor and capable of emitting light according to the electromagnetic field measured by the electromagnetic sensor.

17 Claims, 2 Drawing Sheets

Figure 1:
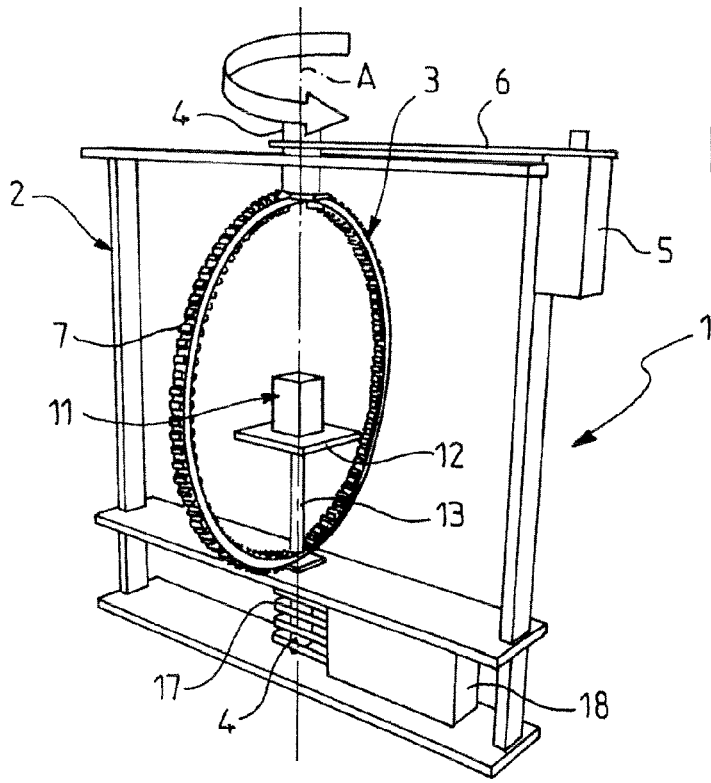

MEASURING DEVICE FOR THE ELECTROMAGNETIC FIELD EMITTED BY AN APPARATUS BEING TESTED

This invention relates to the measurement of the electromagnetic field emitted by a device under test.

The document "*Spherical Near Field Facility for Characterizing Random Emissions*," IEEE Transactions on Antennas and Propagation, p. 2582, Vol. 53, No. 8, August 2005, describes a device for measuring the electromagnetic field that is emitted by a device under test. This device comprises two half-arcs, one of which can rotate around the device under test, to which electromagnetic sensors are attached. The signals that are picked up by the electromagnetic sensors are recorded and processed by a computer. These operations take a relatively long time and are conducted at different times. The processing that is carried out on the computer makes it possible in particular to obtain a graphic representation of the field that is emitted by the device under test on the screen of the computer. It is necessary to make a hypothesis on the field that is emitted by the device under test to select and to calibrate the electromagnetic sensors. If, after the measurement, it is realized that the selection was poor, it is necessary to start all of the operations again.

The invention has as its object to provide a device that does not have at least some of the above-mentioned drawbacks of the prior art.

For this purpose, the invention provides a device for measuring the electromagnetic field that is emitted by a device that is under test, comprising a mobile medium relative to said device under test, at least one electromagnetic sensor attached to said medium, and driving means that can drive said medium in rotation around said device under test, characterized by the fact that it comprises at least one light source that is adjacent to said electromagnetic sensor and able to emit light based on the electromagnetic field that is measured by said electromagnetic sensor.

This device therefore makes it possible to obtain a direct display, i.e., without requiring a screen, of the electromagnetic field emitted by the device under test. In addition, this display is produced in real time. No computer processing is necessary. In a particular embodiment, this direct display takes the form of a light sphere whose color and/or intensity at one given point depends on the electromagnetic field emitted by the device under test in the direction corresponding to this point.

Preferably, the device comprises a large number of electromagnetic sensors that are attached to the medium, and a large number of light sources that are respectively adjacent to one of the electromagnetic sensors and able to emit light based on the electromagnetic field that is measured by the adjacent electromagnetic sensor. For example, each sensor comprises at least one antenna that shows either the electric field or the local magnetic field. Each sensor is preferably made so as to measure a local field as it would exist in the absence of a sensor.

Thus, the device makes it possible to obtain a display of the electromagnetic field that is emitted by the device under test in a large number of different directions.

Advantageously, the light source is arranged so as to emit light in a direction that is opposite to said device under test.

According to a particular embodiment, the light source is able to emit light from a variable surface based on the electromagnetic field that is measured by the electromagnetic sensor.

Based on the arrangement of the variable surface, this makes it possible to show the electromagnetic field by a volume.

Preferably, the driving means are able to drive the medium in rotation around said device under test at a sufficient speed so that the passage frequency of at least one light source at a given point is higher than 24 Hz.

Thus, using the human retinal persistence, an observer can visualize the electromagnetic field in the form of a circle or a surface of revolution (based on the number and the arrangement of the light sources). Of course, the invention is not limited to such passage frequencies. At a lower passage frequency, the observer can visualize a blinking light circle or light surface.

Advantageously, the electromagnetic sensor and the light source are arranged in a box that can be attached to the medium.

In this case, the mounting or the replacement of a sensor and a light source is carried out by the same operation. The box can be, for example, attached to the medium by clamping.

According to a particular embodiment, the medium has electric tracks, whereby the box has contacts in contact with the tracks. The tracks can be power tracks and/or communication tracks.

According to a particular embodiment, the medium has at least one portion of circular shape, whereby the driving means are arranged so that the rotation of the medium generates an essentially spherical surface. The medium can be, for example, a complete circle or a half-circle. The first case is preferred for reasons of balancing rotating parts and because it requires a rotational speed that is two times lower to obtain the above-mentioned effect of retinal persistence.

According to another embodiment, the medium has a portion of rectilinear shape, whereby the driving means are arranged so that the rotation of the medium generates an essentially cylindrical surface of revolution.

Advantageously, the device comprises a plate for said device under test, whereby the plate is attached to the end of a hollow tube.

In this case, it is possible to run a power cable from the device under test through the hollow tube.

According to a particular embodiment, the device comprises a stationary reinforcing structure to which the medium is connected by means of hollow bearings.

When the device under test is a connector that connects two cables, the hollow bearings make it possible to run the cables.

According to a particular embodiment, the device comprises a cage that is made at least partially of transparent material, whereby the medium is arranged in said cage. The cage offers protection essentially without hampering the display of the field.

Preferably, the light source is connected to the electromagnetic sensor using the conversion means. The conversion means comprise, for example, a filter that makes it possible to display certain frequencies of interest, an integrated circuit that can transform the signal coming from the electromagnetic sensor into one or more control signals of the light source, for example to control its color or intensity, a status switch, etc.

Advantageously, the conversion means can be switched among multiple states, whereby the measuring device comprises control means that can communicate with the conversion means using communication means to switch the conversion means. For example, the conversion means can be controlled so that the light source is lit or extinguished based on the position of the medium or based on time, to modify their calibration, to take into consideration a particular component of the field, to modify the characteristics of a frequency filter, etc.

According to a particular embodiment, the conversion means are selected based on an electromagnetic compatibility standard, whereby the measuring device comprises a signal source that is connected to the conversion means and able to emit a non-conformity signal when the electromagnetic field that is measured by the electromagnetic sensor indicates that the device under test is not in accordance with said standard. The non-conformity signal can be, for example, the emission of a particular color by the light source, or the emission of an audible signal by the device.

The invention also provides a use of a device according to the above-mentioned invention, comprising the fact of driving the medium in rotation around said device under test at an adequate speed so that the passage frequency of at least one light source at a given point is more than 24 Hz.

The invention also provides a use of a device according to the above-mentioned invention, comprising the fact of verifying whether a device under test is in accordance with said standard, then the fact of replacing the medium by a second medium, in which said conversion means are selected based on a second standard, and verifying whether said device under test is in accordance with said second standard. This makes it possible to easily verify the conformity to a particular standard. No adjustment is necessary; it is enough to change the medium based on the standard in question.

Figure 3:
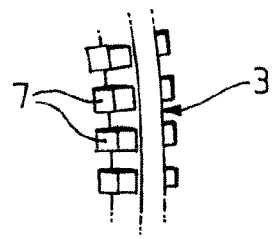
Figure 2:
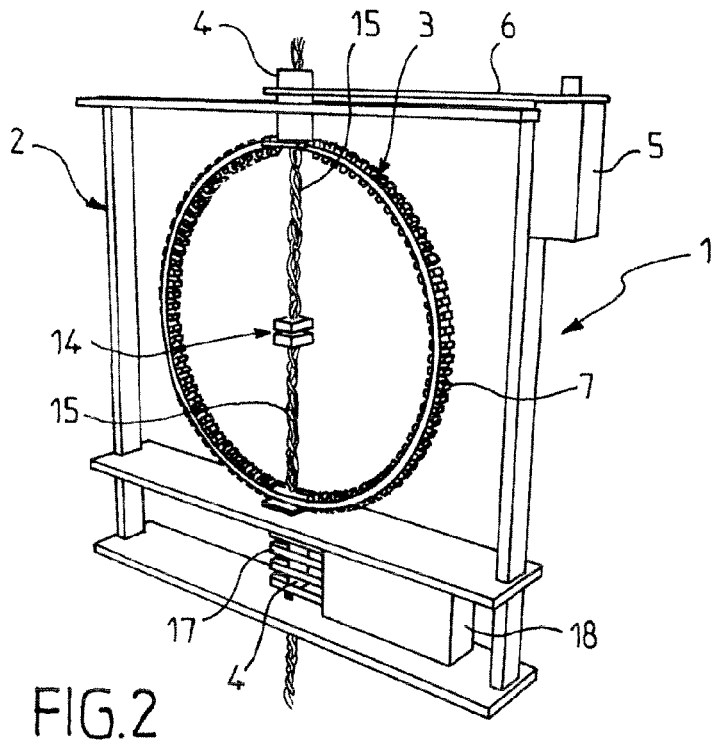
Figure 4:
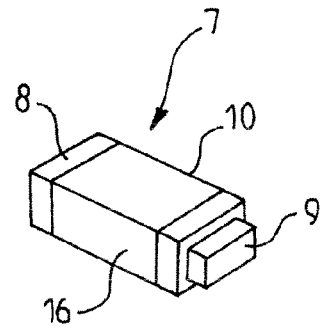
Figure 5:
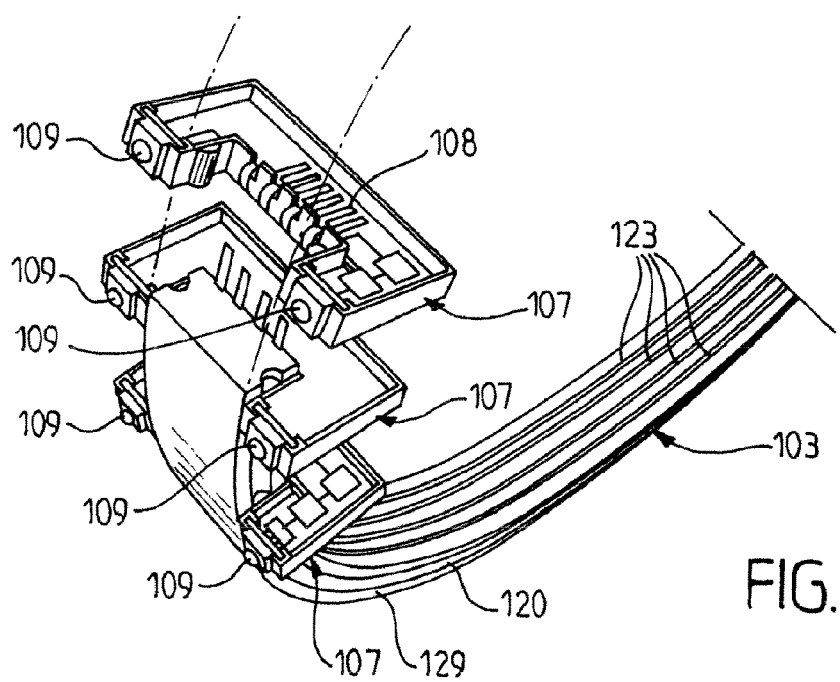
Figure 6:
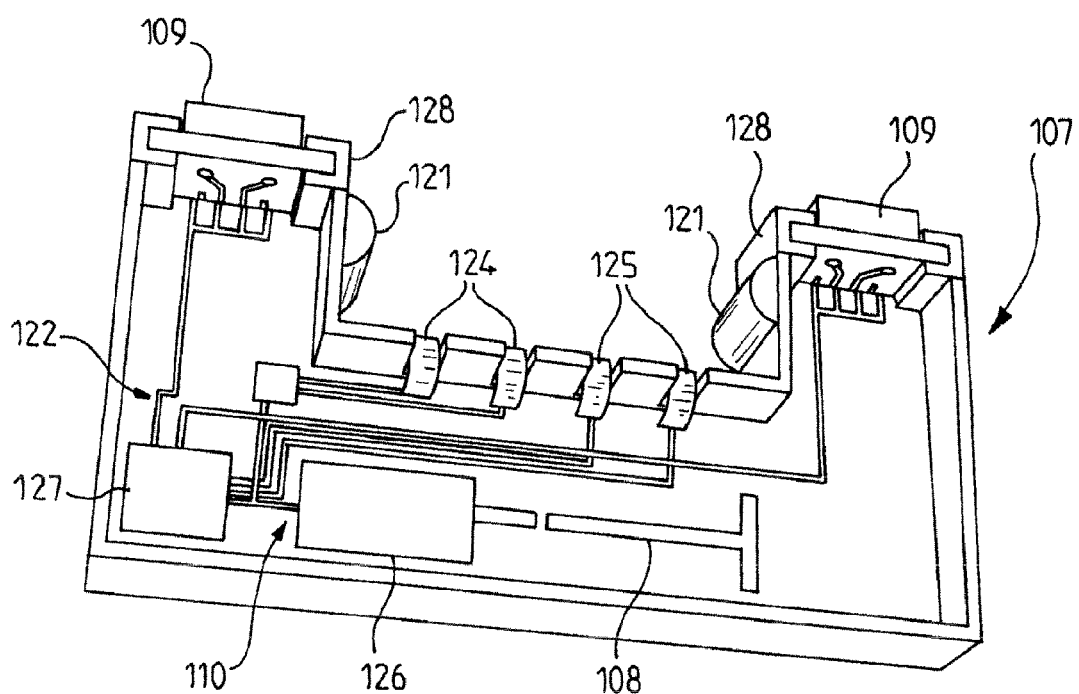

The invention will be better understood, and other objects, details, characteristics and advantages of the latter will emerge more clearly during the following description of several particular embodiments of the invention, given only by way of illustration and not limiting, with reference to the accompanying drawings. In these drawings:

FIG. 1 is a perspective view of a measuring device according to an embodiment of the invention, FIG. 2 is a perspective view of the device of FIG. 1, used to test a connector, FIG. 3 is a perspective view of a detail of the device of FIG. 1, FIG. 4 is a perspective view of a box of the device of FIG. 1, FIG. 5 is a partial view and a perspective view of the medium of a measuring device according to a second embodiment of the invention, FIG. 6 is a perspective view of a box of the device of FIG. 5, whose top wall has been removed.

The measuring device 1 of FIG. 1 comprises a reinforcing structure 2 of an overall rectangular shape. A ring-shaped medium 3 is connected to the reinforcing structure 2 by two bearings 4 so as to be able to rotate around an axis A. The upper bearing 4 is connected to a motor 5, for example an electric motor, by means of a belt 6. The motor 5 is able to drive the medium 3 in rotation at a speed of 12 rps (or more).

A large number of boxes 7 are attached to the medium 3, distributed over its circumference. The boxes 7 are inserted into, for example, slots made in the medium 3, as FIG. 3 shows. A box 7 is shown in more detail in FIG. 4. It comprises an electromagnetic sensor 8 of the side rotated toward the center of the medium 3, a light source 9 from the side opposite to the center of the medium 3, and conversion means 10 that connect the electromagnetic sensor 8 to the light source 9. Thus, the light source 9 emits light in a direction that is opposite to the center of the medium 3, based on the electromagnetic field that is picked up by the electromagnetic sensor 8.

An embodiment for the electromagnetic sensor 8, the light source 9, and the conversion means 10 is provided below, with reference to the embodiment of FIGS. 5 and 6. Of course, the invention is not limited to this example. For example, the light source 9 could be arranged on a side face 16 of the box 7 and emit light from a variable surface based on the electromagnetic field that is picked up by the electromagnetic sensor 8. This makes it possible to display the field by a volume. According to another variant, the electromagnetic sensor 8, the light source 9, and the conversion means 10 are not combined in the same box.

The lower bearing 4 has rings (not shown) in contact with brushes 17, which makes it possible to ensure an electrical connection between the boxes 7 and a control panel 18. The control panel 18 thus can supply the boxes 7 with electricity and/or send control signals to them. The functions of the control signals will be described with reference to the embodiment of FIGS. 5 and 6.

A plate 12 is attached to one end of a hollow tube 13, slightly below the center of the medium 3. Thus, when a device to be tested is placed on the plate 12, for example, a cell phone 11, the latter is found at the center of the medium 3, and therefore at an equal distance from the electromagnetic sensors 8. The hollow tube 13 makes it possible to run a cable (not shown) for the power supply and/or the control of the device under test.

The hollow tube 13 and the plate 12 are removable, and the bearings 4 are hollow. As shown in FIG. 2, this makes it possible, in the case where the device to be tested is a connector 14, to run the cables 15 that are connected by the connector 14.

The general operation of the measuring device 1 will now be described. Particular operating aspects will be described with reference to the embodiment of FIGS. 5 and 6.

A device to be tested, for example a cell phone 11 or a connector 14, is placed approximately in the center of the medium 3. Then, the motor 5 is actuated and drives the medium 3 in rotation at a speed of 12 rps. Each electromagnetic sensor 8 picks up the field that is emitted by the device under test in a particular direction corresponding to its position on the medium 3 and to the position of the medium 3 relative to the reinforcing structure 2, and the associated light source 9 emits the light that depends on the field that is picked up. For example, the color and/or the intensity of the emitted light is based on the field that is picked up by the associated electromagnetic sensor 8. Since the medium 3 rotates, the position of the electromagnetic sensors 8 varies. The field that is picked up by a particular sensor 8 therefore also varies (except in the particular case where the field is uniform), and the emitted light also. The response time of the electromagnetic sensor 8 and the light source 9 is low relative to the speed of rotation of the medium 12 so that the light that is emitted by a light source 9 at a particular point corresponds to the electromagnetic field that is picked up at this particular point.

Since the boxes 7 are distributed essentially over the entire circumference of the medium 3, and the latter rotates at a speed of 12 rps, a light source 9 passes a given point at least 24 times per second. Because of the human retinal persistence, an observer that is located beside the measuring device 1 then sees a light sphere that is generated by light sources 9, whose color and/or intensity at a given point corresponds to the electromagnetic field that is emitted by the device under test in the direction of this point. Of course, based on the shape of the medium, the number of boxes, and their distribution over the medium, other shapes could be produced, for example a cylinder of revolution or a circle.

In FIGS. 5 and 6, elements that are identical or similar to elements of the embodiment of FIGS. 1 to 4 are referred to by the same reference numbers, increased by 100. Some of these elements will not be described in more detail.

The device for measuring the embodiment of FIGS. 5 and 6 differs in particular by the shape of boxes 107. One box 107 has, in top view, an overall U shape, and two studs 121 are arranged on the inside faces 128 of the branches of the U. The medium 103 has a groove 120 on each of its side faces 129. The boxes 107 are attached to the medium 103 by clamping, by inserting the studs 121 into the grooves 120.

A printed circuit 122 is arranged inside the box 107. The electromagnetic sensor 108 is produced in the form of a printed track of a printed circuit 122, which forms an antenna. FIGS. 5 and 6 illustrate two possible forms for the printed track of the electromagnetic sensor 108. The box 107 comprises two light sources 109 that are arranged respectively at the ends of the branches of the U. Each light source 109 comprises three electroluminescent diodes that are red, green and blue in color, which makes it possible to emit light according to a large variety of colors, by combining the light of each diode.

The conversion means 110 that connect the electromagnetic sensor 108 to the light sources 109 comprise tracks of the printed circuit 122, an integrated conversion circuit 126 and a logic unit 127. The integrated conversion circuit 126 is able to transform the signal that is picked up by the electromagnetic sensor 108 into a digital signal that it transmits to the logic unit 127. The logic unit 127 is able to transform this digital signal into a signal for control of the light sources 109. In an embodiment that is not shown, a frequency filter is inserted between the electromagnetic sensor 108 and the integrated conversion circuit 126, which makes it possible to visualize only a particular frequency band of the electromagnetic field.

The box 107 has two power contacts 124 that are in contact with two tracks 123 that are present on the medium 103, which makes it possible to supply the printed circuit 122 with power.

In the embodiment that is shown, the box 107 also has two control signal contacts 125 that are in contact with two other tracks 123. The contacts 125 allow communication between control means (not shown and located, for example, in the control panel) and the conversion means 110. This communication is carried out by implementing a communication protocol, for example of the bus I2C type, on the tracks 123. Of course, other communication means can be considered, for example a wireless communication, provided that this wireless communication uses a frequency band that is separate from the one that is picked up by the electromagnetic sensor 108.

The communication between the control means and the printed circuit 122 makes it possible to carry out one or more functions, for example:

To modify the passband of the frequency filter,
To modify the calibration of the integrated conversion circuit 126,
To modify the adjustment of the logic unit 127 to modify the colors and/or the intensity of the light,
To activate the light sources 109 only when they are in particular positions that correspond, for example, to a given solid angle,
To activate the light sources 109 only at particular moments, corresponding to, for example, the emission of a parasite by the device under test,
In the case where the electromagnetic sensor 108 comprises several antennas, to select one of these antennas to measure a particular component of the magnetic field (for example, an electric component E or a magnetic component H),
To control the light sources 109 to emit light based on a recorded field, instead of the measured field.

In one embodiment, the measuring device also comprises a pointer that a user can manage and direct toward the light surface that is generated by the measuring device during operation. The pointer comprises a light sensor and a display screen. When the user directs the pointer toward a particular point of the light surface, the pointer displays on its screen one or more digital value(s) that correspond(s) to the electromagnetic field that corresponds to the light that is emitted at this particular point. Of course, the pointer is in communication with the control means of the measuring device to introduce the adjustments of the conversion means 10 or 110 and thus to display correct digital values.

In one embodiment, the measuring device comprises several mobile media, located at various distances from the device under test, and which make it possible, for example, for each to visualize a particular frequency band of the electromagnetic field.

Although the invention has been described in connection with several particular embodiments, it is quite obvious that it is in no way limited and that it comprises all of the technical equivalents of the means that are described as well as their combinations if the latter fall within the scope of the invention.

The invention claimed is:

1. Device (1) for measuring the electromagnetic field that is emitted by a device (11, 14) that is under test, comprising a mobile medium (3, 103) relative to said device under test, at least one electromagnetic sensor (8, 108) attached to said medium and driving means (5, 6) that can drive said medium in rotation around said device under test, characterized by the fact that it comprises at least one light source (9, 109) that is adjacent to said electromagnetic sensor and able to emit light based on the electromagnetic field that is measured by said electromagnetic sensor.

2. Device according to claim 1, comprising a large number of electromagnetic sensors that are attached to said medium, and a large number of light sources that are respectively adjacent to one of said electromagnetic sensors and able to emit light based on the electromagnetic field that is measured by the adjacent electromagnetic sensor.

3. Device according to claim 1, wherein said light source is arranged so as to emit light in a direction that is opposite to said device under test.

4. Device according to claim 1, wherein said light source is able to emit light from a variable surface based on the electromagnetic field that is measured by said electromagnetic sensor.

5. Device according to claim 1, wherein said driving means are able to drive said medium in rotation around said device under test at a sufficient speed so that the passage frequency of at least one light source at a given point is more than 24 Hz.

6. Device according to claim 1, wherein said electromagnetic sensor and said light source are arranged in a box (7, 107) that is able to be attached to said medium.

7. Device according to claim 6, wherein said medium has electric tracks (123), whereby said box has contacts (124, 125) in contact with said tracks.

8. Device according to claim 1, wherein said medium has at least one portion of circular shape, whereby said driving means are arranged so that the rotation of said medium generates an approximately spherical surface.

9. Device according to claim 1, wherein said medium has a portion of rectilinear shape, whereby said driving means are arranged so that the rotation of said medium generates an approximately cylindrical surface of revolution.

10. Device according to claim 1, comprising a plate (12) for said device under test, whereby said plate is attached to the end of a hollow tube (13).

11. Device according to claim 1, comprising a stationary reinforcing structure (2) to which is connected said medium by means of hollow bearings (4).

12. Device according to claim 1, comprising a cage that is made at least partially of transparent material, whereby said medium is arranged in said cage.

13. Device according to claim 1, wherein said light source is connected to said electromagnetic sensor using conversion means (10, 110).

14. Device according to claim 13, wherein said conversion means can be switched among multiple states, whereby said measuring device comprises control means (18) that can communicate with said conversion means using communication means for switching said conversion means.

15. Device according to claim 13, wherein said conversion means are selected based on a standard of electromagnetic compatibility, whereby said measuring device comprises a signal source that is connected to said conversion means and able to emit a non-conformity signal when the electromagnetic field that is measured by said electromagnetic sensor indicates that the device under test is not in accordance with said standard.

16. Use of a device according to claim 1, comprising the fact of driving said medium in rotation around said device under test at a sufficient speed so that the passage frequency of at least one light source at a given point is more than 24 Hz.

17. Use of a device according to claim 15, comprising the fact of verifying whether a device under test is in accordance with said standard, then the fact of replacing said medium by a second medium wherein said conversion means are selected based on a second standard and verifying whether said device under test is in accordance with said second standard.

\* \* \* \* \*